United States Patent
Chen

(10) Patent No.: US 11,245,051 B2
(45) Date of Patent: Feb. 8, 2022

(54) MICRO LIGHT EMITTING DIODE APPARATUS AND FABRICATING METHOD THEREOF

(71) Applicant: BOE Technology Group Co., Ltd., Beijing (CN)

(72) Inventor: Yuju Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 329 days.

(21) Appl. No.: 16/485,988

(22) PCT Filed: Oct. 12, 2018

(86) PCT No.: PCT/CN2018/110000
§ 371 (c)(1),
(2) Date: Aug. 14, 2019

(87) PCT Pub. No.: WO2020/073306
PCT Pub. Date: Apr. 16, 2020

(65) Prior Publication Data
US 2021/0336075 A1 Oct. 28, 2021

(51) Int. Cl.
*H01L 33/00* (2010.01)
*H01L 25/075* (2006.01)
(Continued)

(52) U.S. Cl.
CPC ...... *H01L 33/0093* (2020.05); *H01L 25/0753* (2013.01); *H01L 27/1214* (2013.01);
(Continued)

(58) Field of Classification Search
CPC . H01L 33/0093; H01L 33/46; H01L 27/1214; H01L 33/0095; H01L 33/62;
(Continued)

(56) References Cited

U.S. PATENT DOCUMENTS 9,105,714 B2 * 8/2015 Hu ..................... H01L 25/0753
9,166,114 B2 * 10/2015 Hu ..................... H01L 33/0093
(Continued)

FOREIGN PATENT DOCUMENTS

CN 1748312 A 3/2006
CN 101101891 A 1/2008
(Continued)

OTHER PUBLICATIONS

Third Office Action in the Chinese Patent Application No. 201880001628.X, dated Jun. 2, 2021; English translation attached.
(Continued)

*Primary Examiner* — Ismail A Muse
(74) *Attorney, Agent, or Firm* — Intellectual Valley Law, P.C.

(57) ABSTRACT

A method of fabricating a micro light emitting diode (micro LED) apparatus includes forming a first substrate including a first silicon layer, a second silicon layer, and a silicon oxide layer sandwiched between the first silicon layer and the second silicon layer; forming a plurality of micro LEDs on a side of the second silicon layer distal to the silicon oxide layer; bonding the first substrate having the plurality of micro LEDs with a second substrate; and removing the silicon oxide layer and the first silicon layer.

18 Claims, 8 Drawing Sheets

(51) Int. Cl.
*H01L 27/12* (2006.01)
*H01L 33/46* (2010.01)
*H01L 33/62* (2010.01)

(52) U.S. Cl.
CPC .......... *H01L 33/0095* (2013.01); *H01L 33/46* (2013.01); *H01L 33/62* (2013.01); *H01L 2933/0025* (2013.01); *H01L 2933/0066* (2013.01)

(58) Field of Classification Search
CPC ......... H01L 25/0753; H01L 2933/0066; H01L 2933/0025
See application file for complete search history.

(56) References Cited

U.S. PATENT DOCUMENTS

| | | | | |
|---|---|---|---|---|
| 9,217,541 | B2* | 12/2015 | Bathurst | B81C 99/002 |
| 9,935,136 | B2* | 4/2018 | Chen | H01L 21/6835 |
| 10,193,042 | B1* | 1/2019 | Tsai | H01L 33/60 |
| 2002/0041725 | A1* | 4/2002 | Carroll | G02B 6/4214 |
| | | | | 385/14 |
| 2002/0192888 | A1* | 12/2002 | Ajmera | H01L 29/7834 |
| | | | | 438/197 |
| 2006/0051945 | A1 | 3/2006 | Yokokawa et al. | |
| 2010/0055818 | A1 | 3/2010 | Chen et al. | |
| 2012/0037925 | A1* | 2/2012 | Sheen | H01L 33/007 |
| | | | | 257/79 |
| 2013/0157419 | A1* | 6/2013 | Shimizu | H01L 21/568 |
| | | | | 438/127 |
| 2014/0159065 | A1* | 6/2014 | Hu | H01L 33/0093 |
| | | | | 257/88 |
| 2014/0159066 | A1* | 6/2014 | Hu | H01L 25/0753 |
| | | | | 257/88 |
| 2014/0340900 | A1* | 11/2014 | Bathurst | B81C 99/002 |
| | | | | 362/249.02 |
| 2015/0155331 | A1 | 6/2015 | Guenard | |
| 2015/0179892 | A1 | 6/2015 | Wu et al. | |
| 2015/0316719 | A1* | 11/2015 | Nakagawa | G02F 1/025 |
| | | | | 216/24 |
| 2017/0301724 | A1* | 10/2017 | Lee | H01L 33/52 |
| 2020/0161290 | A1* | 5/2020 | Chaji | H01L 33/0075 |
| 2020/0258861 | A1* | 8/2020 | Zhong | H01L 24/95 |
| 2020/0273848 | A1* | 8/2020 | Zhong | H01L 33/0095 |
| 2020/0286949 | A1* | 9/2020 | Lee | H01L 23/544 |
| 2021/0336074 | A1* | 10/2021 | Sun | H01L 25/0753 |

FOREIGN PATENT DOCUMENTS

| | | |
|---|---|---|
| CN | 101667615 A | 3/2010 |
| CN | 101847646 A | 9/2010 |
| CN | 102820416 A | 12/2012 |
| CN | 108010933 A | 5/2018 |

OTHER PUBLICATIONS

International Search Report & Written Opinion dated Jul. 1, 2019, regarding PCT/CN2018/110000.

* cited by examiner

MICRO LIGHT EMITTING DIODE APPARATUS AND FABRICATING METHOD THEREOF

CROSS-REFERENCE TO RELATED APPLICATION

This application is a national stage application under 35 U.S.C. § 371 of International Application No. PCT/CN2018/110000, filed Oct. 12, 2018, the contents of which are incorporated by reference in the entirety.

TECHNICAL FIELD

The present invention relates to display technology, more particularly, to a method of fabricating a micro light emitting diode apparatus and a micro light emitting diode apparatus.

BACKGROUND

In recent years, miniaturized electro-optics devices are proposed and developed, including micro light emitting diode (micro LED). The micro LED-based display panels have the advantages of high brightness, high contrast ratio, fast response, and low power consumption. The micro LED-based display technology has found a wide range of applications in the display field, including smartphones and smart watches.

SUMMARY

In one aspect, the present invention provides a method of fabricating a micro light emitting diode (micro LED) apparatus, comprising forming a first substrate comprising a first silicon layer, a second silicon layer, and a silicon oxide layer sandwiched between the first silicon layer and the second silicon layer; forming a plurality of micro LEDs on a side of the second silicon layer distal to the silicon oxide layer; bonding the first substrate having the plurality of micro LEDs with a second substrate; and removing the silicon oxide layer and the first silicon layer.

Optionally, forming the first substrate comprises providing a silicon wafer; implanting oxygen ions through a surface of the silicon wafer into the silicon wafer to a depth greater than zero; and annealing the silicon wafer subsequent to implanting oxygen ions to form the silicon oxide layer.

Optionally, removing the silicon oxide layer and the first silicon layer comprises etching the silicon oxide layer by a dry etching process using hydrogen fluoride as a dry etchant.

Optionally, subsequent to etching the silicon oxide layer, the method further comprises etching the second silicon layer using a wet etchant.

Optionally, removing the silicon oxide layer and the first silicon layer comprises etching the silicon oxide layer by a wet etching process using an acidic solution comprising hydrogen fluoride.

Optionally, subsequent to bonding the first substrate having the plurality of micro LEDs with the second substrate, and removing the silicon oxide layer and the first silicon layer, the method further comprises forming a distributed Bragg reflector on a side of the second silicon layer distal to the plurality of micro LEDs.

Optionally, prior to bonding the first substrate having the plurality of micro LEDs with the second substrate, and removing the silicon oxide layer and the first silicon layer, the method further comprises etching the first substrate having the plurality of micro LEDs to form a plurality of light emitting islands; wherein bonding the first substrate having the plurality of micro LEDs with the second substrate is performed subsequent to etching the first substrate having the plurality of micro LEDs to form the plurality of light emitting islands; and removing the silicon oxide layer and the first silicon layer is performed subsequent to bonding the first substrate having the plurality of micro LEDs with the second substrate.

Optionally, etching the first substrate having the plurality of micro LEDs to form the plurality of light emitting islands is performed using an inductively coupled plasma etching process; and removing the silicon oxide layer and the first silicon layer comprises etching the silicon oxide layer by a wet etching process using an acidic solution comprising hydrogen fluoride.

Optionally, subsequent to bonding the first substrate having the plurality of micro LEDs with the second substrate, and removing the silicon oxide layer and the first silicon layer, the method further comprises etching the first substrate having the plurality of micro LEDs to form a plurality of light emitting islands; wherein removing the silicon oxide layer and the first silicon layer is performed subsequent to bonding the first substrate having the plurality of micro LEDs with the second substrate.

Optionally, etching the first substrate having the plurality of micro LEDs to form the plurality of light emitting islands is performed subsequent to forming the distributed Bragg reflector on the side of the second silicon layer distal to the plurality of micro LEDs.

Optionally, etching the first substrate having the plurality of micro LEDs to form the plurality of light emitting islands is performed using an inductively coupled plasma etching process; and removing the silicon oxide layer and the first silicon layer comprises etching the silicon oxide layer by a wet etching process using an acidic solution comprising hydrogen fluoride.

Optionally, the distributed Bragg reflector formed on a side of the second silicon layer distal to the plurality of micro LEDs is configured to reflect red light from red light emitting micro LEDs and green light from green light emitting micro LEDs.

Optionally, the distributed Bragg reflector formed on a side of the second silicon layer distal to the plurality of micro LEDs is configured to reflect blue light from blue light emitting micro LEDs.

Optionally, oxygen ions is implanted through the surface of the silicon wafer into the silicon wafer to a depth less than approximately 100 nm; and the second silicon layer is formed to have a thickness greater than zero and less than approximately 100 nm.

Optionally, annealing the silicon wafer is performed at an annealing temperature in a range of approximately 1000 degrees to approximately 1600 degrees.

Optionally, the method further comprises forming a third substrate comprising a third silicon layer, a fourth silicon layer, and a second silicon oxide layer sandwiched between the third silicon layer and the fourth silicon layer; forming a plurality of second micro LEDs on a side of the fourth silicon layer distal to the second silicon oxide layer, bonding the third substrate having the plurality of second micro LEDs with the second substrate; and removing the second silicon oxide layer and the third silicon layer; wherein a light emitting color of the plurality of micro LEDs is different from a light emitting color of the plurality of second micro LEDs.

Optionally, subsequent to bonding the first substrate having the plurality of micro LEDs with the second substrate, and removing the silicon oxide layer and the first silicon layer, the method further comprises forming a first distributed Bragg reflector on a side of the second silicon layer distal to the plurality of micro LEDs; subsequent to bonding the third substrate having the plurality of second micro LEDs with the second substrate, and removing the second silicon oxide layer and the third silicon layer, the method further comprises forming a second distributed Bragg reflector on a side of the fourth silicon layer distal to the plurality of second micro LEDs.

Optionally, the first distributed Bragg reflector is configured to reflect red light from red light emitting micro LEDs and green light from green light emitting micro LEDs; and the second distributed Bragg reflector is configured to reflect blue light from blue light emitting micro LEDs.

Optionally, the second substrate is a thin film transistor array substrate.

In another aspect, the present invention provides a micro light emitting diode (micro LED) apparatus comprising a thin film transistor array substrate; a plurality of micro LEDs bound to the thin film transistor array substrate, the thin film transistor array substrate comprising a plurality of thin film transistors respectively configured to drive light emission of the plurality of micro LEDs; and a thin silicon layer on a side of the plurality of micro LEDs distal to the thin film transistor array substrate; wherein the thin silicon layer has a thickness greater than zero and less than approximately 100 nm.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Conventional methods of fabricating a micro LED apparatus typically uses a laser lift off technique in a transferring process in which micro LEDs are transferred from a mother substrate to a target substrate. The laser lift off process often damages the GaN layer in the micro LEDs due to the high energy potential of the laser. Also, the laser lift off process is highly energy-consuming and time-consuming.

Accordingly, the present disclosure provides, inter alia, a method of fabricating a micro light emitting diode and a micro light emitting diode apparatus that substantially obviate one or more of the problems due to limitations and disadvantages of the related art. In one aspect, the present disclosure provides a method of fabricating a micro light emitting diode (micro LED) apparatus. In some embodiments, the method includes forming a first substrate including a first silicon layer, a second silicon layer, and a silicon oxide layer sandwiched between the first silicon layer and the second silicon layer; forming a plurality of micro LEDs on a side of the second silicon layer distal to the silicon oxide layer; bonding the first substrate having the plurality of micro LEDs with a second substrate; and etching the silicon oxide layer to remove the silicon oxide layer. As used herein, the term "silicon oxide" refers to a material including $SiO_x$, $0<x\leq2$. Optionally, silicon oxide may be doped with a dopant, e.g., one or more metal or non-metal elements.

Figure 1A:
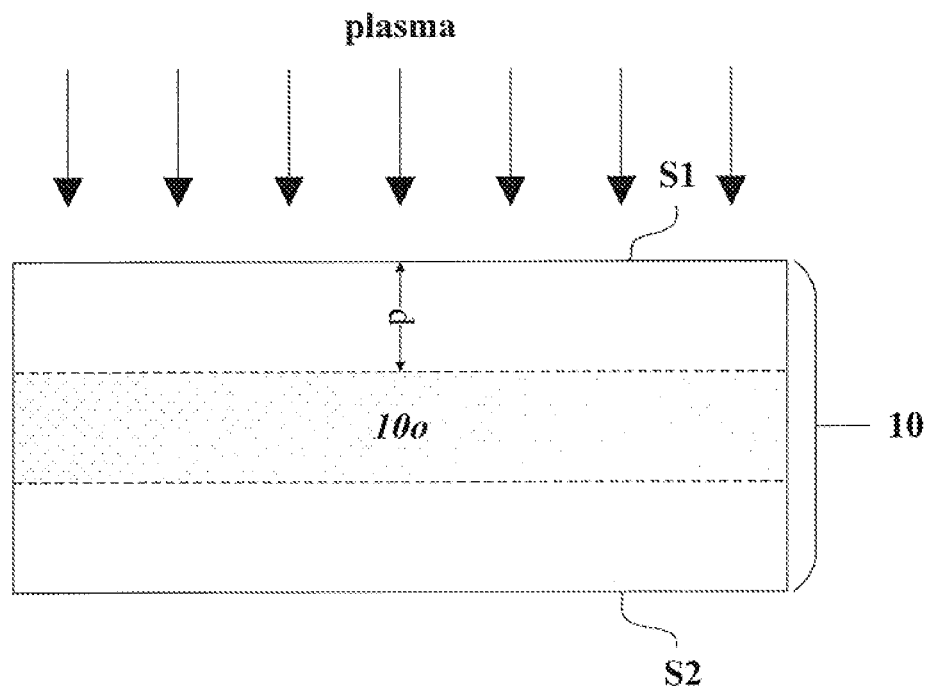
FIGS. 1A to 1F illustrate a process of fabricating a micro light emitting diode (micro LED) apparatus in some embodiments according to the present disclosure.

FIGS. 1A to 1F illustrate a process of fabricating a micro light emitting diode (micro LED) apparatus in some embodiments according to the present disclosure. Referring to FIG. 1A, a silicon wafer 10 is provided. The silicon wafer 10 is treated with an oxygen-containing plasma. Oxygen ions are implanted through a surface of the silicon wafer 10 into the silicon wafer 10 to a depth d greater than zero. The plasma treatment results in formation of a locally formed oxygen implantation layer 10o, which is spaced apart from surfaces of the silicon wafer (e.g., surfaces S1 and S2 in FIG. 1A). For example, the locally formed oxygen implantation layer 10o is spaced apart from a surface of the silicon wafer exposed to the oxygen-containing plasma by the distance d, as shown in FIG. 1A. Optionally, the locally formed oxygen implantation layer 10o is a buried layer in the silicon wafer 10, the layers to either sides of the locally formed oxygen implantation layer 10o remain substantially unchanged by the plasma treatment. For example, the layers to either sides of the locally formed oxygen implantation layer 10o remain as silicon layers.

Optionally, the distance d is greater than zero and less than 500 nm, e.g., greater than zero and less than 400 nm, greater than zero and less than 300 m, greater than zero and less than 200 nm, greater than zero and less than 150 nm, greater than zero and less than 100 nm, and greater than zero and less than 50 nm. By keeping the distance d small, the transmissivity of the device can be enhanced.

Optionally, the oxygen implantation process can be repeated at least one more time, e.g., twice, three times, four time, and five time.

Figure 1B:
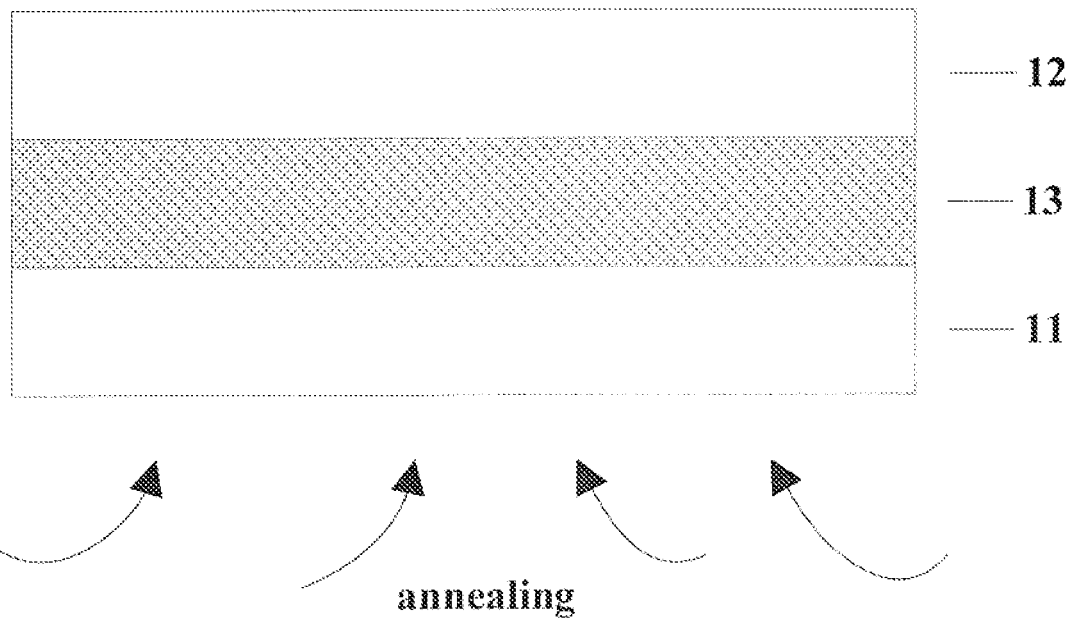

Referring to FIG. 1B, subsequent to the oxygen implantation process, the silicon wafer 10 is annealed to form a silicon oxide layer 13. During the annealing process, the locally formed oxygen implantation layer 10o is oxidized by the implanted oxygen, resulting in silicon oxide. Various appropriate annealing conditions may be used to anneal the silicon wafer 10. In one example, the annealing is performed at an annealing temperature in a range of approximately 500 degrees to approximately 3200 degrees, e.g., approximately 500 degrees to approximately 1000 degrees, approximately 1000 degrees to approximately 1600 degrees, and approximately 1600 degrees to approximately 3200 degrees. Optionally, the annealing temperature is in a range of approximately 1200 degrees to approximately 1400 degrees, e.g., approximately 1300 degrees.

Referring to FIG. 1B, subsequent to the annealing process, a first substrate is formed, the first substrate including a first silicon layer 11, a second silicon layer 12, and a silicon oxide layer 13 sandwiched between the first silicon layer 11 and the second silicon layer 12. Various alternative appropriate methods may be used for making the first substrate.

Optionally, the second silicon layer 12 is formed to have a thickness greater than zero and less than approximately 500 nm, e.g., greater than zero and less than 400 nm, greater than zero and less than 300 nm, greater than zero and less than 200 nm, greater than zero and less than 150 nm, greater than zero and less than 100 nm, and greater than zero and less than 50 nm. By keeping the distance d small, the transmissivity of the device can be enhanced. For example, by keeping the distance d less than 100 nm, the thickness of the second silicon layer 12 can be kept less than 100 nm, the light transmissivity of the second silicon layer 12 and the overall light transmissivity of the device can be maintained at a relatively higher level.

Figure 1C:
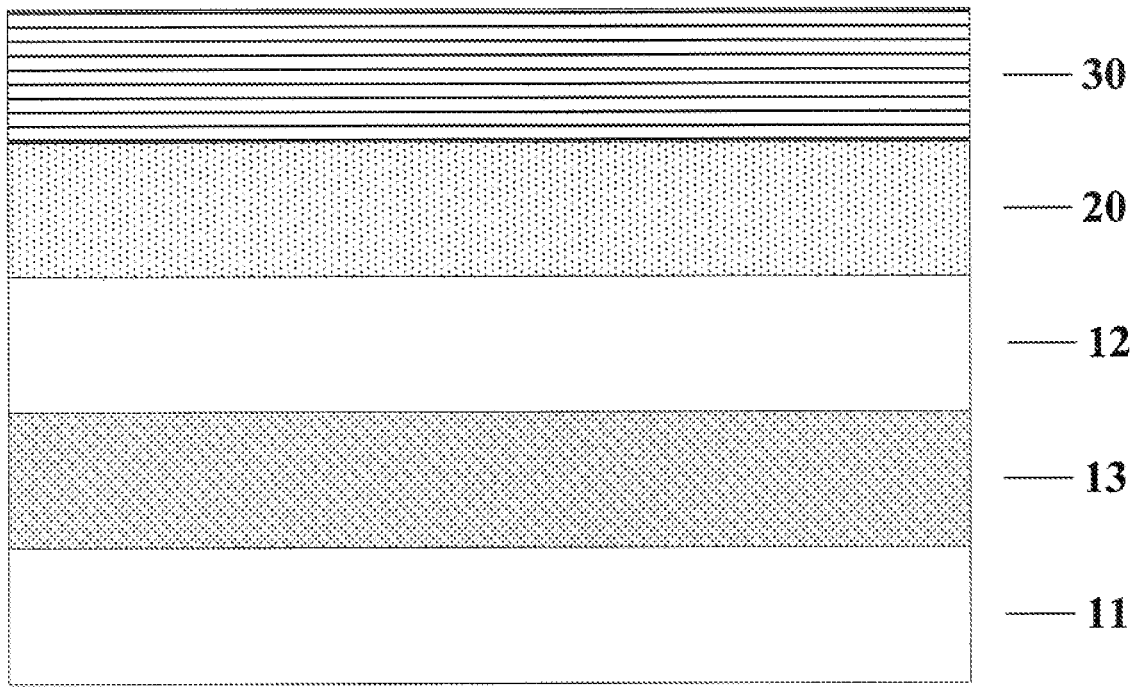

Referring to FIG. 1C, a buffer layer 20 (e.g., an AlGaN buffer layer) is formed on a side of the second silicon layer 12 distal to the silicon oxide layer 13, and a plurality of layers 30 of a plurality of micro LEDs are formed on a side of the buffer layer 20 distal to the second silicon layer 12.

In some embodiments, the plurality of layers 30 of a plurality of micro LEDs includes a multiple quantum wells layer, a p-current spreading layer, an n-current spreading layer. Optionally, the plurality of layers 30 of a plurality of micro LEDs further includes an electron blocking layer. Optionally, the plurality of layers 30 of a plurality of micro LEDs further includes a p-contact layer and an n-contact layer.

Figure 1D:
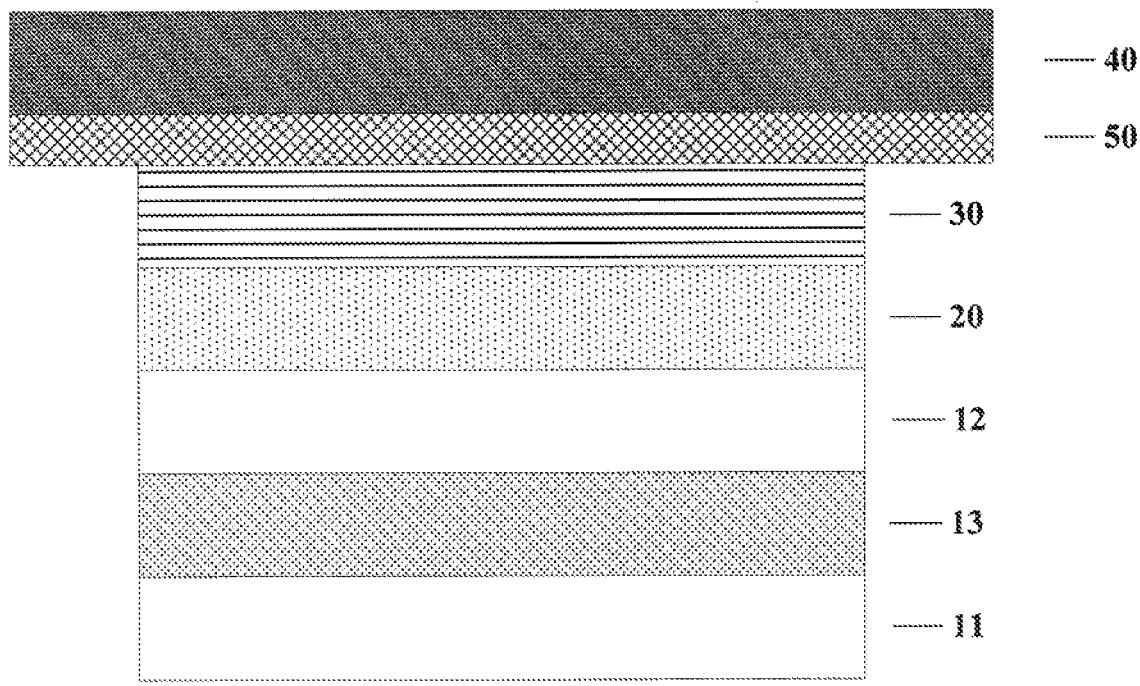

Referring to FIG. 1D, the first substrate having the plurality of layers 30 of the plurality of micro LEDs formed thereon is bonded with a second substrate 40. Optionally, the first substrate is bonded with the second substrate 40 through a bonding material layer 50 (e.g., a metal bonding layer). The first substrate is bonded to the second substrate 40 through a side having the plurality of layers 30 of the plurality of micro LEDs formed thereon.

Figure 1E:
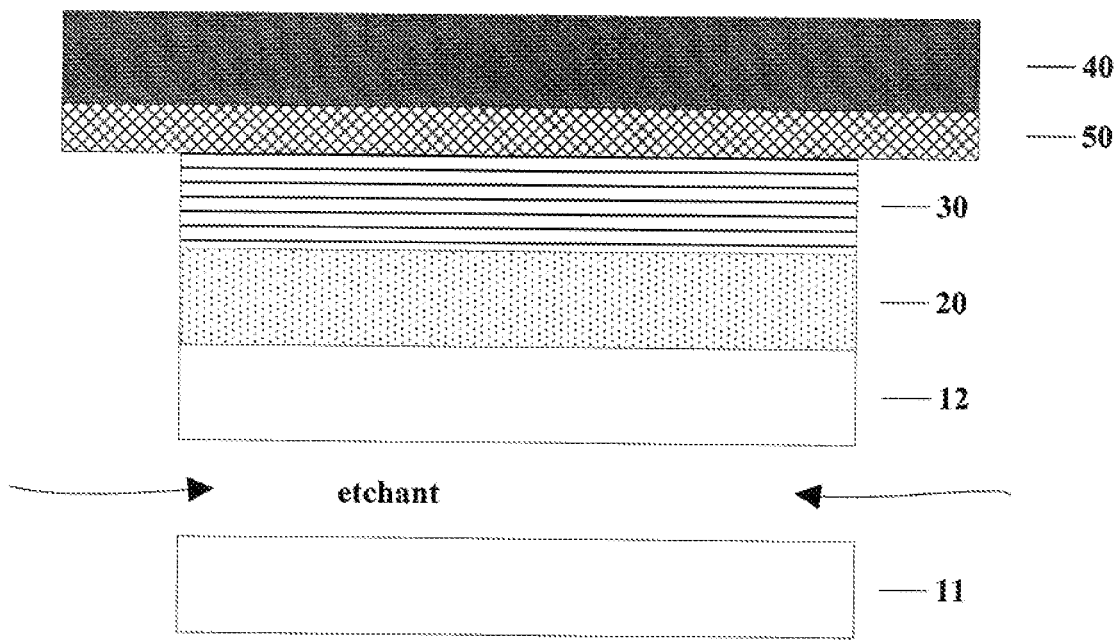
Figure 1F:
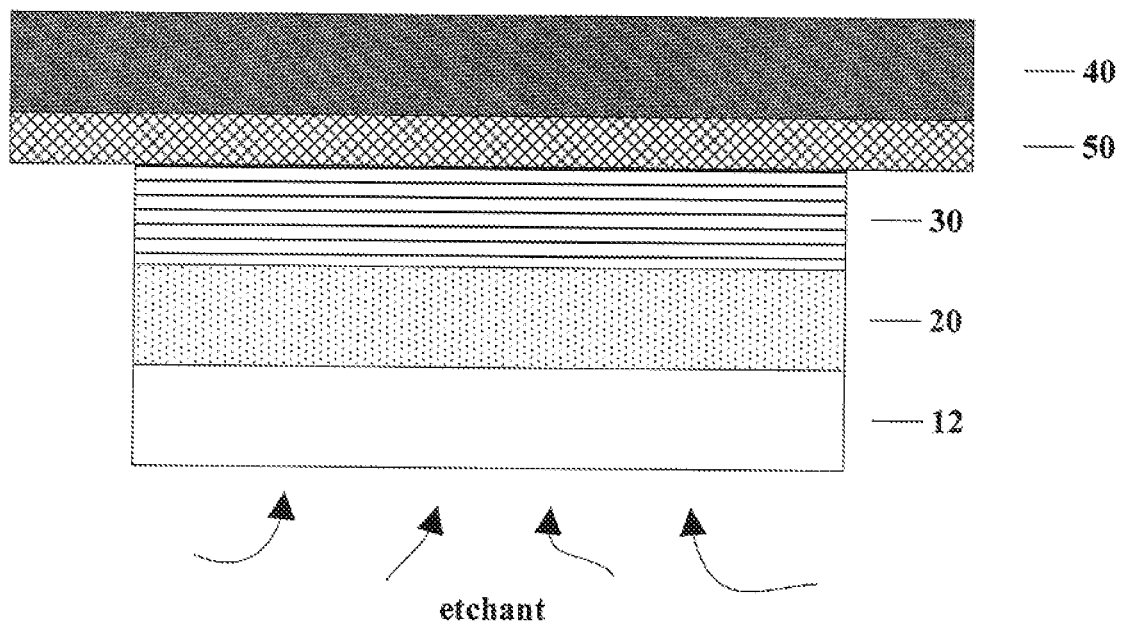

Referring to FIG. 1E, subsequent to bonding the first substrate with the second substrate 40, the silicon oxide layer 13 is etched by a first etchant and eventually removed. With the silicon oxide layer 13 removed, the first silicon layer 11 falls off. Referring to FIG. 1F, subsequent to etching and removing the silicon oxide layer 13, the second silicon layer 12 can be further etched by a second etchant and removed.

Various appropriate etchant and various appropriate etching methods may be used for etching the silicon oxide layer 13. Examples of appropriate etching methods include wet etching and dry etching. Similarly, the silicon oxide layer 13 may be etched by either a dry etchant or a wet etchant, or a combination. In some embodiments, the first etchant include hydrogen fluoride. Optionally, the dry etchant is an etchant including hydrogen fluoride in gas form. Optionally, the wet etchant is an acidic solution including hydrogen fluoride. In one example, the wet etchant is an acidic solution including hydrogen fluoride (e.g., 40% v/v), isopropyl alcohol (e.g., 10% v/v), and acetic acid.

Various appropriate etchant and various appropriate etching methods may be used for etching the second silicon layer 12. Examples of appropriate etching methods include wet etching and dry etching. Similarly, the second silicon layer 12 may be etched by either a dry etchant or a wet etchant, or a combination. In some embodiments, the second etchant include hydrogen fluoride. Optionally, the wet etchant is an acidic solution including hydrogen fluoride. In one example, the wet etchant is an acidic solution including hydrogen fluoride, nitric acid, and acetic acid.

Figure 2A:
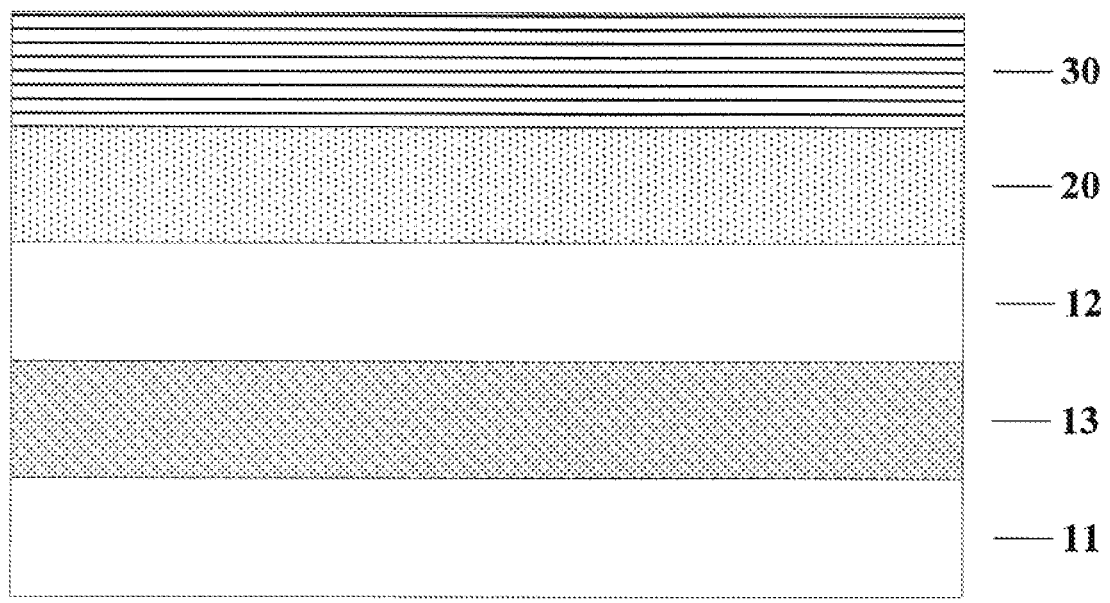
FIGS. 2A to 2E illustrate a process of fabricating a micro light emitting diode (micro LED) apparatus in some embodiments according to the present disclosure.

FIGS. 2A to 2E illustrate a process of fabricating a micro light emitting diode (micro LED) apparatus in some embodiments according to the present disclosure. Referring to FIG. 2A, a first substrate includes a first silicon layer 11, a second silicon layer 12, and a silicon oxide layer 13 sandwiched between the first silicon layer 11 and the second silicon layer 12. In one example, the first substrate may be formed using a process depicted in FIGS. 1A to 1F. Subsequently, a buffer layer 20 is formed on the second silicon layer 12, and a plurality of layers 30 of a plurality of micro LEDs are formed on a side of the second silicon layer 12 distal to the silicon oxide layer 13.

Figure 2B:
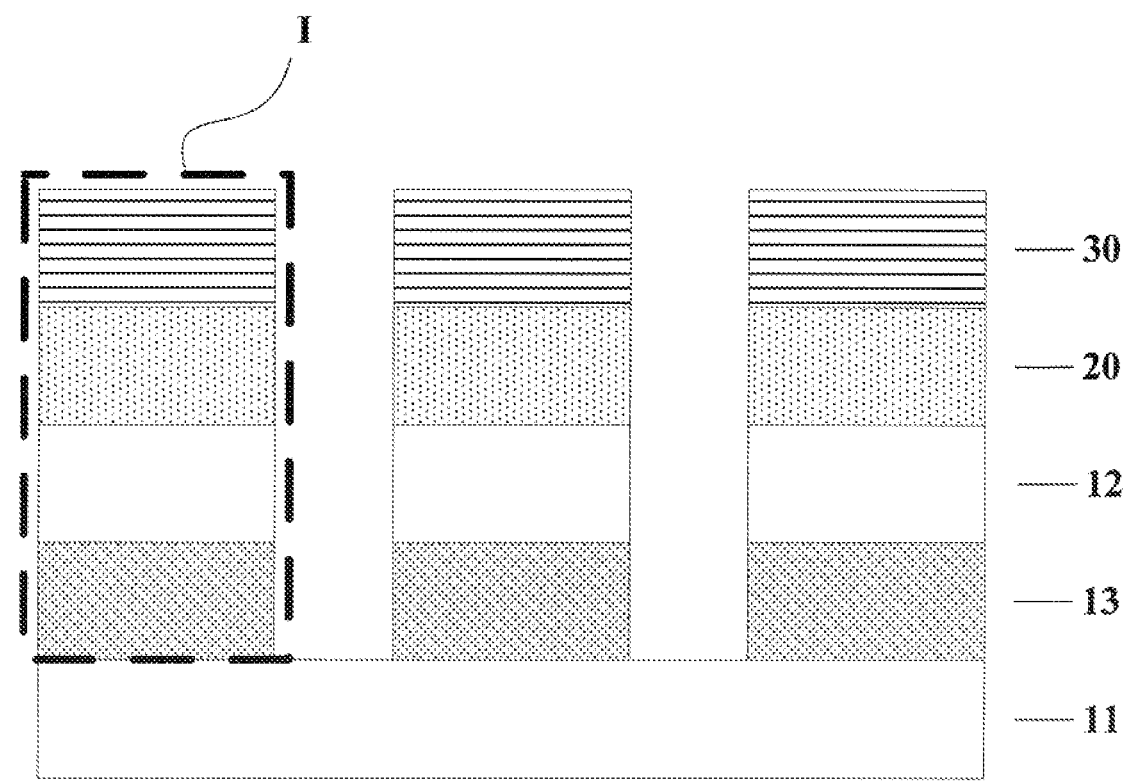

Referring to FIG. 2B, prior to bonding the first substrate having the plurality of layers 30 of the plurality of micro LEDs with a second substrate, and etching the silicon oxide layer 13, in some embodiments, the first substrate having the plurality of layers 30 of the plurality of micro LEDs is etched to form a plurality of light emitting islands I. For example, each of the plurality of light emitting islands I includes one of the plurality of micro LEDs, constituting a subpixel of the micro LED apparatus.

Various appropriate etching methods may be used for forming the plurality of light emitting islands I. Examples of etching methods include, but are not limited to, reactive ion etching (RIE), deep reactive ion etching (DRIE), inductively coupled plasma etching (ICP), electron cyclotron resonance etching (ECR), ion beam etching, and laser machining. Various etching gas may be used for dry etching. Examples of plasma etching gas include, but are not limited to, boron chloride ($BCl_3$) and chlorine ($Cl_2$). In some embodiments, the step of etching the first substrate having the plurality of layers 30 of the plurality of micro LEDs to form the plurality of light emitting islands I is performed using an inductively coupled plasma etching process. Examples of plasma etching gas for performing the inductively coupled plasma etching process includes boron chloride ($BCl_3$), carbon fluoride ($CF_4$), and chlorine ($Cl_2$).

In one example, as shown in FIG. 2B, the plurality of light emitting islands I are formed so that the second silicon layer 12 and the silicon oxide layer 13 are etched through, and the first silicon layer 11 remains as a continuous layer. Optionally, the plurality of light emitting islands I may be formed so that one or both of the silicon oxide layer 13 and the second silicon layer 12 additionally remain as continuous layers, e.g., not etched through.

Figure 2C:
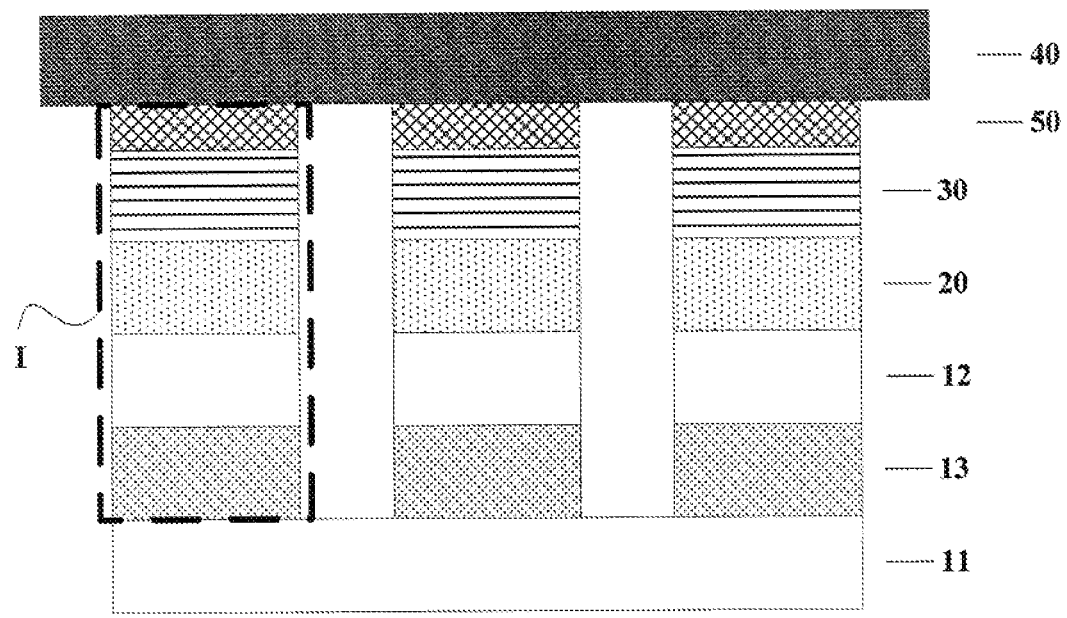

Referring to FIG. 2C, subsequent to etching the first substrate having the plurality of layers 30 of the plurality of micro LEDs to form the plurality of light emitting islands I, the first substrate having the plurality of layers 30 of the plurality of micro LEDs and etched to have the plurality of light emitting islands I is then bonded with a second substrate 40, e.g., through a bonding material layer 50.

Figure 2D:
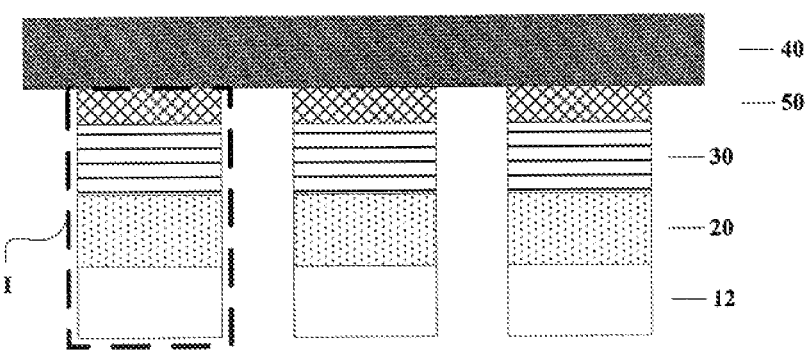
Figure 2D:
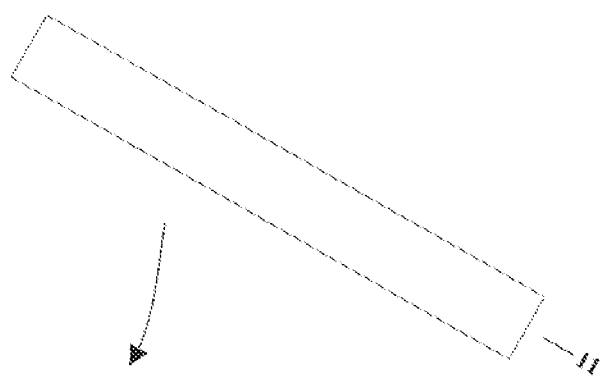

Referring to FIG. 2D, subsequent to bonding the first substrate having the plurality of layers 30 of the plurality of micro LEDs with the second substrate 40, the silicon oxide layer 13 is etched to remove the first silicon layer 11 and the silicon oxide layer 13. Optionally, etching the silicon oxide layer 13 is performed by a wet etching process using an acidic solution including hydrogen fluoride. Optionally, the wet etchant is an acidic solution including hydrogen fluoride. In one example, the wet etchant is an acidic solution including hydrogen fluoride (e.g., 40% v/v), isopropyl alcohol (e.g., 10% v/v), and acetic acid. By first forming the plurality of light emitting islands I, the contact area between the silicon oxide layer 13 and the etchant can be significantly increased, achieving a greater etching rate.

Figure 2E:
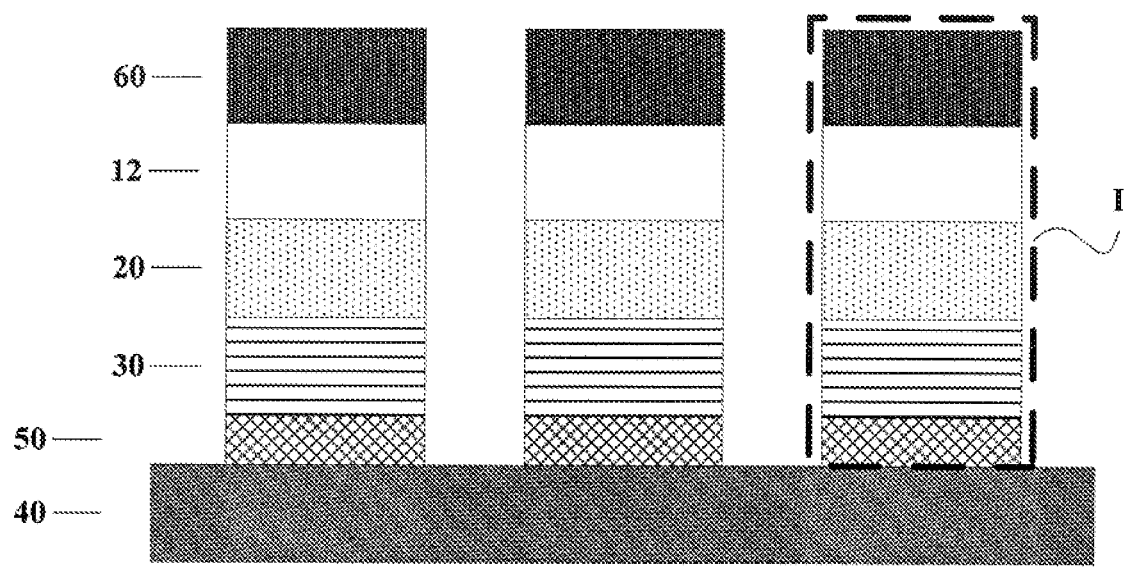

Referring to FIG. 2E, subsequent to bonding the first substrate having the plurality of layers 30 of the plurality of micro LEDs with the second substrate 40, and etching the silicon oxide layer 13, a distributed Bragg reflector 60 is formed on a side of the second silicon layer 12 distal to the plurality of layers 30 of the plurality of micro LEDs. Optionally, the distributed Bragg reflector 60 includes at least a first sub-layer of a high refractive index and a second sub-layer of a low refractive index. The first sub-layer includes a material having a refractive index higher than that of a material of the second sub-layer. Optionally, the first sub-layer includes titanium oxide and the second sub-layer includes silicon oxide. Optionally, the first sub-layer includes hafnium oxide and the second sub-layer includes silicon oxide. Optionally, the first sub-layer includes gallium nitride and the second sub-layer includes aluminum nitride. Optionally, the distributed Bragg reflector 60 formed on a side of the second silicon layer 12 distal to the plurality of layers 30 of the plurality of micro LEDs is configured to reflect red light from red light emitting micro LEDs. Optionally, the distributed Bragg reflector 60 formed on a side of the second silicon layer 12 distal to the plurality of layers 30 of the plurality of micro LEDs is configured to reflect green light from green light emitting micro LEDs. Optionally, the distributed Bragg reflector 60 formed on a side of the second silicon layer 12 distal to the plurality of layers 30 of the plurality of micro LEDs is configured to reflect red light from red light emitting micro LEDs and green light from green light emitting micro LEDs. Optionally, the distributed Bragg reflector 60 formed on a side of the second silicon layer 12 distal to the plurality of layers 30 of the plurality of micro LEDs is configured to reflect blue light from blue light emitting micro LEDs.

Optionally, the distributed Bragg reflector 60 includes a plurality of high refractive index sub-layers and a plurality of low refractive index sub-layers alternately arranged, e.g., having a HL . . . HL structure, wherein H stands for a sub-layer having a high refractive index, and L stands for a sub-layer having a low refractive index. Optionally, the H sub-layer includes titanium oxide and the L sub-layer includes silicon oxide. Optionally, the H sub-layer includes hafnium oxide and the L sub-layer includes silicon oxide. Optionally, the H sub-layer includes gallium nitride and the L sub-layer includes aluminum nitride.

Figure 3A:
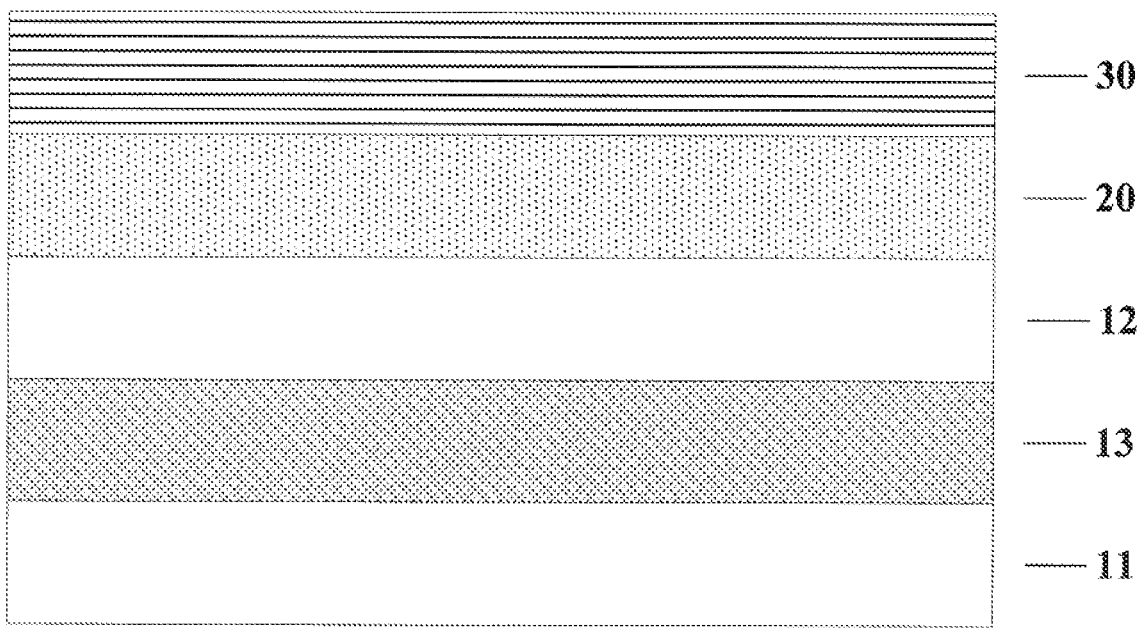
FIGS. 3A to 3E illustrate a process of fabricating a micro light emitting diode (micro LED) apparatus in some embodiments according to the present disclosure.

FIGS. 3A to 3E illustrate a process of fabricating a micro light emitting diode (micro LED) apparatus in some embodiments according to the present disclosure. Referring to FIG. 3A, a first substrate includes a first silicon layer 11, a second silicon layer 12, and a silicon oxide layer 13 sandwiched between the first silicon layer 11 and the second silicon layer 12. In one example, the first substrate may be formed using a process depicted in FIGS. 1A to 1F. Subsequently, a buffer layer 20 is formed on the second silicon layer 12, and a plurality of layers 30 of a plurality of micro LEDs are formed on a side of the second silicon layer 12 distal to the silicon oxide layer 13.

Figure 3B:
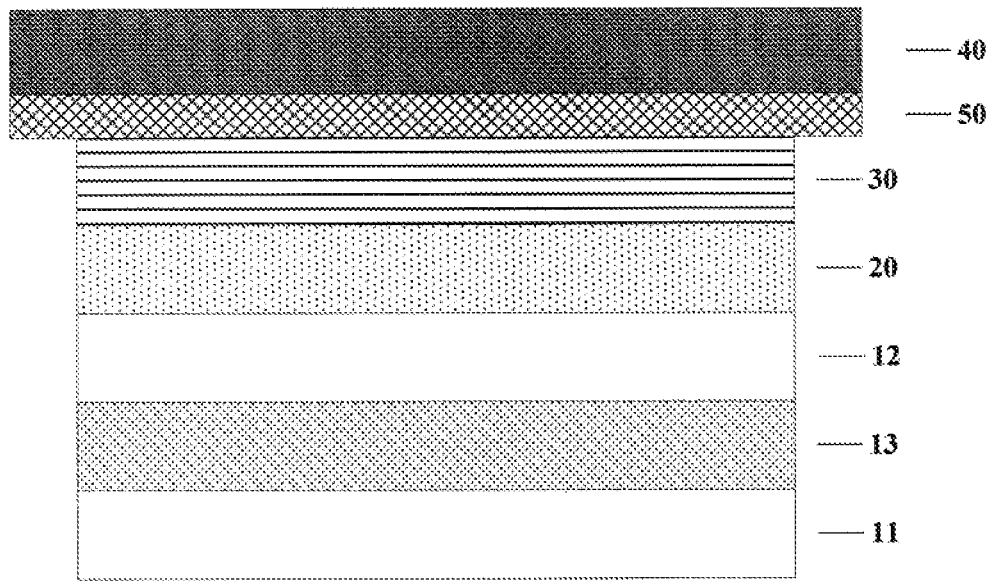

Referring to FIG. 3B, subsequent to forming the plurality of layers 30 of a plurality of micro LEDs on a side of the second silicon layer 12 distal to the silicon oxide layer 13, the first substrate having the plurality of layers 30 of the plurality of micro LEDs is bonded with the second substrate 40, e.g., through a bonding material layer 50.

Figure 3C:
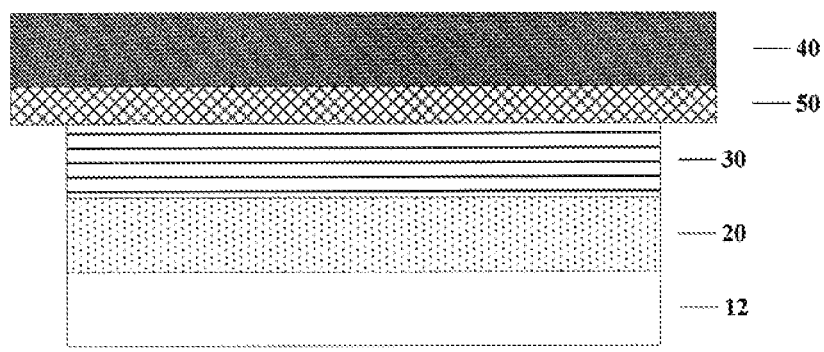
Figure 3C:
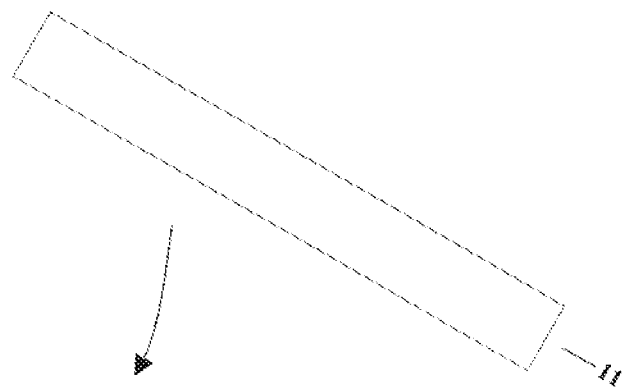

Referring to FIG. 3C, subsequent to bonding the first substrate having the plurality of layers 30 of the plurality of micro LEDs with the second substrate 40, the silicon oxide layer 13 is etched to remove the first silicon layer 11 and the silicon oxide layer 13. Optionally, etching the silicon oxide layer 13 is performed by a wet etching process using an acidic solution including hydrogen fluoride. Optionally, the wet etchant is an acidic solution including hydrogen fluoride. In one example, the wet etchant is an acidic solution including hydrogen fluoride (e.g., 40% v/v), isopropyl alcohol (e.g., 10% v/v), and acetic acid.

Figure 3D:
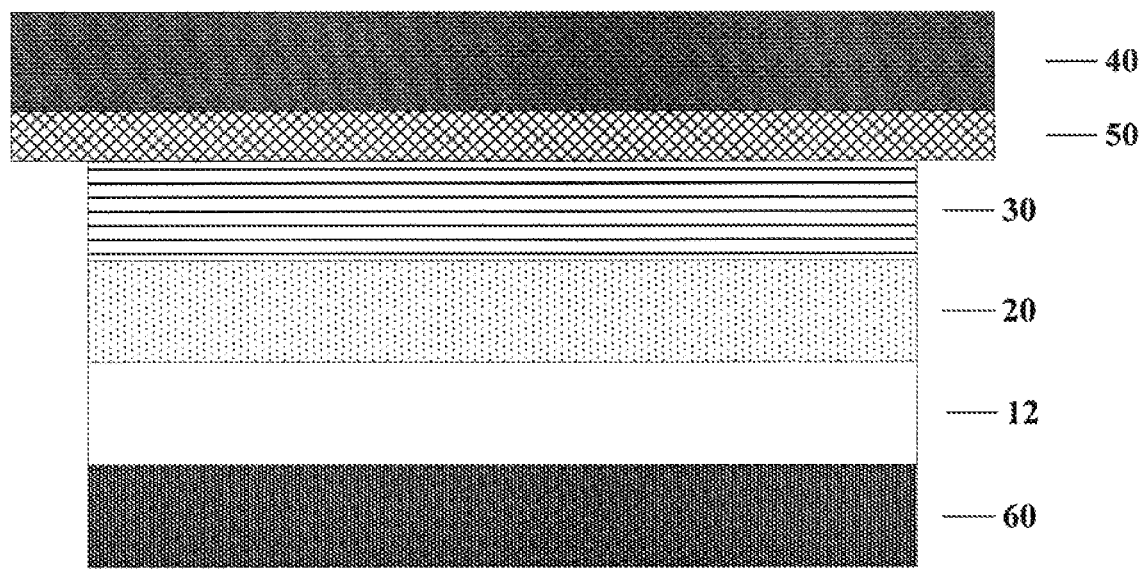

Referring to FIG. 3D, subsequent to bonding the first substrate having the plurality of layers 30 of the plurality of micro LEDs with the second substrate 40, and etching the silicon oxide layer 13 to remove the first silicon layer 11 and the silicon oxide layer 13 from the first substrate, a distributed Bragg reflector 60 is formed on a side of the second silicon layer 12 distal to the plurality of layers 30 of the plurality of micro LEDs. Optionally, the distributed Bragg reflector 60 includes at least a first sub-layer of a high refractive index and a second sub-layer of a low refractive index. The first sub-layer includes a material having a refractive index higher than that of a material of the second sub-layer. Optionally, the first sub-layer includes titanium oxide and the second sub-layer includes silicon oxide. Optionally, the first sub-layer includes hafnium oxide and the second sub-layer includes silicon oxide. Optionally, the first sub-layer includes gallium nitride and the second sub-layer includes aluminum nitride. Optionally, the distributed Bragg reflector 60 formed on a side of the second silicon layer 12 distal to the plurality of layers 30 of the plurality of micro LEDs is configured to reflect red light from red light emitting micro LEDs. Optionally, the distributed Bragg reflector 60 formed on a side of the second silicon layer 12 distal to the plurality of layers 30 of the plurality of micro LEDs is configured to reflect green light from green light emitting micro LEDs. Optionally, the distributed Bragg reflector 60 formed on a side of the second silicon layer 12 distal to the plurality of layers 30 of the plurality of micro LEDs is configured to reflect red light from red light emitting micro LEDs and green light from green light emitting micro LEDs. Optionally, the distributed Bragg reflector 60 formed on a side of the second silicon layer 12 distal to the plurality of layers 30 of the plurality of micro LEDs is configured to reflect blue light from blue light emitting micro LEDs.

Optionally, the distributed Bragg reflector 60 includes a plurality of high refractive index sub-layers and a plurality of low refractive index sub-layers alternately arranged, e.g., having a HL . . . HL structure, wherein H stands for a sub-layer having a high refractive index, and L stands for a sub-layer having a low refractive index. Optionally, the H sub-layer includes titanium oxide and the L sub-layer includes silicon oxide. Optionally, the H sub-layer includes hafnium oxide and the L sub-layer includes silicon oxide. Optionally, the H sub-layer includes gallium nitride and the L sub-layer includes aluminum nitride.

Figure 3E:
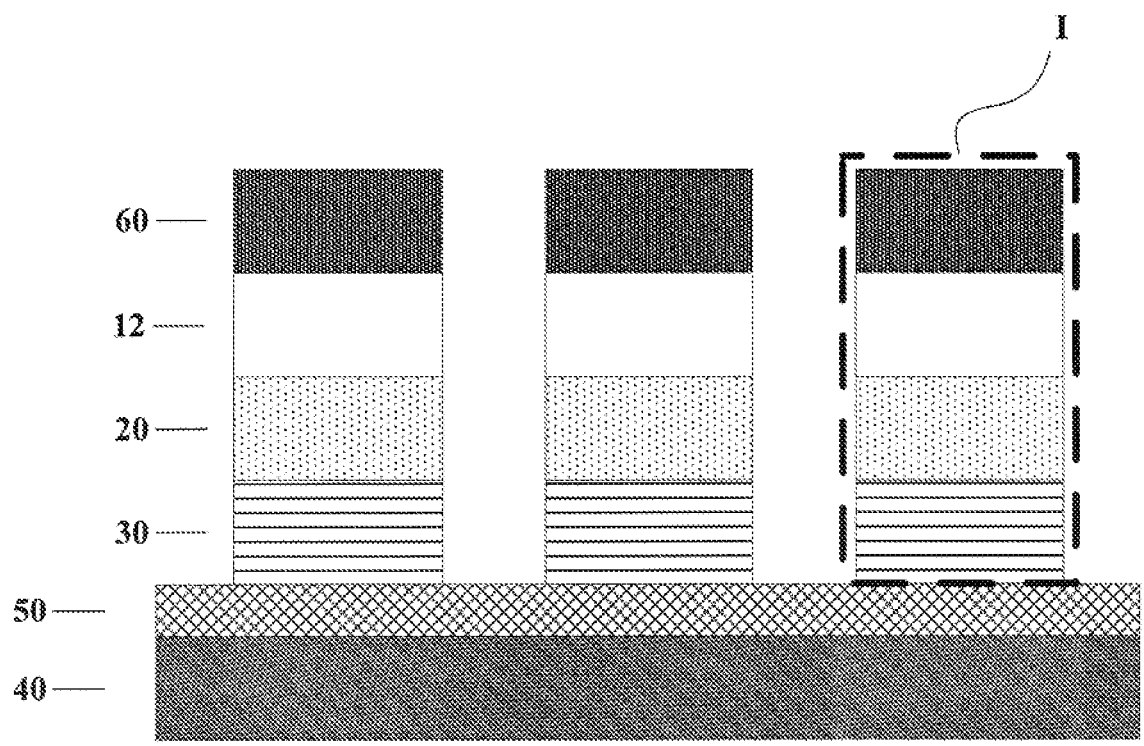

Referring to FIG. 3E, subsequent to forming the distributed Bragg reflector 60 on the side of the second silicon layer 12 distal to the plurality of layers 30 of the plurality of micro LEDs, the first substrate having the plurality of layers 30 of the plurality of micro LEDs and the distributed Bragg reflector 60 formed thereon is etched to form a plurality of light emitting islands I. For example, each of the plurality of light emitting islands I includes one of the plurality of micro LEDs, constituting a subpixel of the micro LED apparatus. The methods for forming the plurality of light emitting islands I are similar to those described in connection with FIG. 2B.

In FIG. 3D and FIG. 3E, the distributed Bragg reflector 60 is formed prior to forming the plurality of light emitting islands I. In some embodiments, the distributed Bragg reflector 60 is formed subsequent to etching the first substrate having the plurality of layers 30 of the plurality of micro LEDs to form the plurality of light emitting islands I. For example, the distributed Bragg reflector 60 is formed on each individual one of the plurality of light emitting islands I, and on a side of the second silicon layer 12 distal to the buffer layer 20.

In some embodiments, the second substrate 40 is a thin film transistor array substrate having a plurality of thin film transistors. When the first substrate having the plurality of layers 30 of the plurality of micro LEDs is bonded with the second substrate 40, each of the plurality of micro LEDs is connected to one of the plurality of thin film transistors in the thin film transistor array substrate.

In one example, each of the plurality of micro LEDs is formed to include a n-GaN layer, a multiple quantum well, and a p-GaN layer.

Various appropriate bonding materials and bonding techniques may be used for bonding the first substrate with the thin film transistor array substrate. In one example, the bonding material layer 50 is a metal bonding material layer (e.g., a gold/tin bonding layer). In another example, the bonding material layer 50 includes benzocyclobutene (BCB). In another example, the bonding material layer 50 is a solder layer. In another example, the bonding material layer 50 is a frit layer.

Various appropriate materials may be used for making the buffer layer 20. Examples of appropriate materials for making the buffer layer 20 include AlGaN.

In some embodiments, subsequent to bonding the first substrate having the plurality of layers 30 of the plurality of micro LEDs with the second substrate 40, etching the silicon oxide layer 13, and forming the distributed Bragg reflector 60, the method further includes patterning the substrate to complete the micro LED fabrication. In one example, the method further includes etching through a U-GaN layer and a buffer layer, thereby exposing an n-GaN layer. In another example, the method further includes forming an insulating protective layer. In another example, the method further includes forming a p-contact layer and a n-contact layer. The contact electrodes may be formed using a metallic material such as titanium/aluminum.

In some embodiments, prior to etching the silicon oxide layer 13, other layers of the substrate (e.g., the first substrate) is treated with a protective layer (e.g., a photoresist layer) to protect the other layers of the substrate from being etched by the etchant. In one example, the back side of the substrate (e.g., the first substrate) is covered with a protective layer prior to the step of etching the silicon oxide layer 13.

In some embodiments, the plurality of micro LEDs may be transferred to the second substrate 40 in more than one transferring processes. In some embodiments, the fabricating process includes transferring a plurality of first micro LEDs in a first transferring process and transferring a plurality of second micro LEDs in a second transferring process, the plurality of first micro LEDs and the plurality of second micro LEDs being transferred to a same thin film transistor array substrate. The plurality of first micro LEDs transferred to the target thin film transistor array substrate constitute a plurality of first subpixels. The plurality of second micro LEDs transferred to the target thin film transistor array substrate constitute a plurality of second subpixels. Optionally, a light emitting color of the plurality of first micro LEDs is different from a light emitting color of the plurality of second micro LEDs. Optionally, a light emitting color of the plurality of first subpixels is different from a light emitting color of the plurality of second subpixels.

Accordingly, in another aspect, the present disclosure provides a method of fabricating a micro light emitting diode apparatus, e.g., a micro light emitting diode display apparatus. In some embodiments, the method includes forming a first substrate including a first silicon layer, a second silicon layer, and a first silicon oxide layer sandwiched between the first silicon layer and the second silicon layer, forming a plurality of layers of a plurality of first micro LEDs on a side of the second silicon layer distal to the first silicon oxide layer; bonding the first substrate having the plurality of layers of the plurality of first micro LEDs with a second substrate; and etching the first silicon oxide layer to remove the first silicon oxide layer. Optionally, the method further includes forming a third substrate including a third silicon layer, a fourth silicon layer, and a second silicon oxide layer sandwiched between the third silicon layer and the fourth silicon layer; forming a plurality of layers of a plurality of second micro LEDs on a side of the fourth silicon layer distal to the second silicon oxide layer; bonding the third substrate having the plurality of layers of the plurality of second micro LEDs with the second substrate; and etching the second silicon oxide layer to remove the second silicon oxide layer. A light emitting color of the plurality of first micro LEDs is different from a light emitting color of the plurality of second micro LEDs.

In some embodiments, a first distributed Bragg reflector and a second distributed Bragg reflector may be respectively formed for the plurality of first micro LEDs and the plurality of second micro LEDs. In some embodiments, the method further includes forming a first distributed Bragg reflector on a side of the second silicon layer distal to the plurality of layers of the plurality of first micro LEDs subsequent to bonding the first substrate having the plurality of layers of the plurality of first micro LEDs with the second substrate, and etching the first silicon oxide layer. In some embodiments, the method further includes forming a second distributed Bragg reflector on a side of the fourth silicon layer distal to the plurality of layers of the plurality of second micro LEDs subsequent to bonding the third substrate having the plurality of layers of the plurality of second micro LEDs with the second substrate, and etching the second silicon oxide layer.

Optionally, the first distributed Bragg reflector is configured to reflect red light from red light emitting micro LEDs and green light from green light emitting micro LEDs. Optionally, the second distributed Bragg reflector is configured to reflect blue light from blue light emitting micro LEDs.

In another aspect, the present disclosure provides a micro light emitting diode apparatus, e.g., a micro light emitting diode display apparatus. Examples of appropriate micro light emitting diode display apparatuses include, but are not limited to, an electronic paper, a mobile phone, a tablet computer, a television, a monitor, a notebook computer, a digital album, a GPS, etc. In some embodiments, the micro light emitting diode apparatus includes a thin film transistor array substrate, a plurality of micro LEDs bound to the thin film transistor array substrate, and a thin silicon layer on a side of the plurality of micro LEDs distal to the thin film transistor array substrate. The thin film transistor array substrate includes a plurality of thin film transistors respectively configured to drive light emission of the plurality of micro LEDs. In some embodiments, the thin silicon layer has a thickness in a range of greater than zero and less than approximately 500 nm, e.g., greater than zero and less than 400 nm, greater than zero and less than 300 nm, greater than zero and less than 200 nm, greater than zero and less than 150 nm, greater than zero and less than 100 nm, and greater than zero and less than 50 nm. The thin silicon layer consists essentially of silicon, e.g., polycrystalline silicon and amorphous silicon. Optionally, the thin silicon layer consists of silicon.

In some embodiments, the micro light emitting diode apparatus further includes a distributed Bragg reflector on the side of the thin silicon layer distal to the plurality of micro LEDs. The distributed Bragg reflector is directly formed on the thin silicon layer, e.g., in direct contact with the thin silicon layer.

In some embodiments, the micro light emitting diode apparatus further includes a buffer layer between the thin silicon layer and the plurality of micro LEDs.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a micro light emitting diode (micro LED) apparatus, comprising:
    forming a first substrate comprising a first silicon layer, a second silicon layer, and a silicon oxide layer sandwiched between the first silicon layer and the second silicon layer;
    forming a plurality of micro LEDs on a side of the second silicon layer distal to the silicon oxide layer;
    bonding the first substrate having the plurality of micro LEDs with a second substrate; and
    removing the silicon oxide layer and the first silicon layer;
    wherein the second substrate is a thin film transistor array substrate.

2. The method of claim 1, wherein forming the first substrate comprises:
    providing a silicon wafer;
    implanting oxygen ions through a surface of the silicon wafer into the silicon wafer to a depth greater than zero; and
    annealing the silicon wafer subsequent to implanting oxygen ions to form the silicon oxide layer.

3. The method of claim 2, wherein oxygen ions is implanted through the surface of the silicon wafer into the silicon wafer to a depth less than approximately 100 nm; and
    the second silicon layer is formed to have a thickness greater than zero and less than approximately 100 nm.

4. The method of claim 2, wherein annealing the silicon wafer is performed at an annealing temperature in a range of approximately 1000 Celsius degrees to approximately 1600 Celsius degrees.

5. The method of claim 1, wherein removing the silicon oxide layer and the first silicon layer comprises etching the silicon oxide layer by a dry etching process using hydrogen fluoride as a dry etchant.

6. The method of claim 5, subsequent to etching the silicon oxide layer, further comprising etching the second silicon layer using a wet etchant.

7. The method of claim 1, wherein removing the silicon oxide layer and the first silicon layer comprises etching the silicon oxide layer by a wet etching process using an acidic solution comprising hydrogen fluoride.

8. The method of claim 1, subsequent to bonding the first substrate having the plurality of micro LEDs with the second substrate, and removing the silicon oxide layer and the first silicon layer, further comprising forming a distributed Bragg reflector on a side of the second silicon layer distal to the plurality of micro LEDs.

9. The method of claim 8, prior to bonding the first substrate having the plurality of micro LEDs with the second substrate, and removing the silicon oxide layer and the first silicon layer, further comprising etching the first substrate having the plurality of micro LEDs to form a plurality of light emitting islands;
    wherein bonding the first substrate having the plurality of micro LEDs with the second substrate is performed subsequent to etching the first substrate having the plurality of micro LEDs to form the plurality of light emitting islands; and
    removing the silicon oxide layer and the first silicon layer is performed subsequent to bonding the first substrate having the plurality of micro LEDs with the second substrate.

10. The method of claim 9, wherein etching the first substrate having the plurality of micro LEDs to form the plurality of light emitting islands is performed using an inductively coupled plasma etching process; and
    removing the silicon oxide layer and the first silicon layer comprises etching the silicon oxide layer by a wet etching process using an acidic solution comprising hydrogen fluoride.

11. The method of claim 8, subsequent to bonding the first substrate having the plurality of micro LEDs with the second substrate, and removing the silicon oxide layer and the first silicon layer, further comprising etching the first substrate having the plurality of micro LEDs to form a plurality of light emitting islands;
    wherein removing the silicon oxide layer and the first silicon layer is performed subsequent to bonding the first substrate having the plurality of micro LEDs with the second substrate.

12. The method of claim 11, wherein etching the first substrate having the plurality of micro LEDs to form the plurality of light emitting islands is performed subsequent to forming the distributed Bragg reflector on the side of the second silicon layer distal to the plurality of micro LEDs.

13. The method of claim 11, wherein etching the first substrate having the plurality of micro LEDs to form the plurality of light emitting islands is performed using an inductively coupled plasma etching process; and removing the silicon oxide layer and the first silicon layer comprises etching the silicon oxide layer by a wet etching process using an acidic solution comprising hydrogen fluoride.

14. The method of claim 8, wherein the distributed Bragg reflector formed on a side of the second silicon layer distal to the plurality of micro LEDs is configured to reflect red light from red light emitting micro LEDs and green light from green light emitting micro LEDs.

15. The method of claim 8, wherein the distributed Bragg reflector formed on a side of the second silicon layer distal to the plurality of micro LEDs is configured to reflect blue light from blue light emitting micro LEDs.

16. The method of claim 1, further comprising:

forming a third substrate comprising a third silicon layer, a fourth silicon layer, and a second silicon oxide layer sandwiched between the third silicon layer and the fourth silicon layer;

forming a plurality of second micro LEDs on a side of the fourth silicon layer distal to the second silicon oxide layer;

bonding the third substrate having the plurality of second micro LEDs with the second substrate; and removing the second silicon oxide layer and the third silicon layer;

wherein a light emitting color of the plurality of micro LEDs is different from a light emitting color of the plurality of second micro LEDs.

17. The method of claim 16, wherein, subsequent to bonding the first substrate having the plurality of micro LEDs with the second substrate, and removing the silicon oxide layer and the first silicon layer, further comprising forming a first distributed Bragg reflector on a side of the second silicon layer distal to the plurality of micro LEDs; and subsequent to bonding the third substrate having the plurality of second micro LEDs with the second substrate, and removing the second silicon oxide layer and the third silicon layer, further comprising forming a second distributed Bragg reflector on a side of the fourth silicon layer distal to the plurality of second micro LEDs.

18. The method of claim 17, wherein the first distributed Bragg reflector is configured to reflect red light from red light emitting micro LEDs and green light from green light emitting micro LEDs; and the second distributed Bragg reflector is configured to reflect blue light from blue light emitting micro LEDs.

* * * * *